US012764875B2

(12) United States Patent
Wilson et al.

(10) Patent No.: US 12,764,875 B2
(45) Date of Patent: Oct. 13, 2026

(54) DAMPER FOR A PRINTED CIRCUIT BOARD ASSEMBLY

(71) Applicant: Micron Technology, Inc., Boise, ID (US)

(72) Inventors: Kaleb A. Wilson, Caldwell, ID (US); Bradley R. Bitz, Meridian, ID (US); Mark A. Tverdy, Boise, ID (US); Quang Nguyen, Boise, ID (US); Christopher Glancey, Boise, ID (US); Jagadeesh B. Ginjupalli, Fremont, CA (US); Pridhvi Dandu, Colorado, CA (US)

(73) Assignee: Micron Technology, Inc., Boise, ID (US)

( * ) Notice: Subject to any disclaimer, the term of this patent is extended or adjusted under 35 U.S.C. 154(b) by 465 days.

(21) Appl. No.: 17/962,927

(22) Filed: Oct. 10, 2022

(65) Prior Publication Data

US 2024/0117855 A1 Apr. 11, 2024

(51) Int. Cl.
*H05K 5/02* (2006.01)
*G06F 1/184* (2026.01)

(52) U.S. Cl.
CPC ........... *H05K 5/0217* (2013.01); *G06F 1/184* (2013.01)

(58) Field of Classification Search
CPC ....... H05K 5/0217; G06F 1/183; G06F 1/187; G06F 1/1658; G06F 1/182
See application file for complete search history.

(56) References Cited

U.S. PATENT DOCUMENTS

| | | | | | |
|---|---|---|---|---|---|
| 6,022,234 | A * | 2/2000 | Shinoto | G06F 1/184 361/801 |
| 6,751,092 | B1 * | 6/2004 | Ohnishi | G06F 1/1616 248/560 |
| 7,079,380 | B2 * | 7/2006 | Wubs | G11B 33/08 |
| 7,471,509 | B1 * | 12/2008 | Oliver | G11B 25/043 361/728 |
| 8,213,174 | B1 * | 7/2012 | Kapahi | G06F 1/183 361/759 |
| 8,379,381 | B1 * | 2/2013 | Tran | H05K 7/1461 361/679.33 |
| 8,649,168 | B2 * | 2/2014 | Ozeki | G06F 1/187 248/633 |
| 8,971,036 | B1 * | 3/2015 | Lau | G06F 1/20 361/679.34 |
| 9,099,163 | B1 * | 8/2015 | Casey | G11B 33/08 |
| 9,661,765 | B2 * | 5/2017 | Wakana | H05K 5/006 |
| 9,798,361 | B2 * | 10/2017 | Kim | H05K 5/0256 |
| 2005/0039995 | A1 * | 2/2005 | Inoke | G06F 1/1658 188/371 |
| 2005/0047077 | A1 * | 3/2005 | Koh | G11B 25/043 |

(Continued)

FOREIGN PATENT DOCUMENTS

| | | | |
|---|---|---|---|
| CN | 106455377 | A | 2/2017 |
| JP | 5196587 | B2 | 5/2013 |
| KR | 101076303 | B1 | 10/2011 |

*Primary Examiner* — Sagar Shrestha
(74) *Attorney, Agent, or Firm* — Brooks, Cameron & Huebsch, PLLC

(57) ABSTRACT

Apparatuses, systems, and methods for a damper for a printed circuit board assembly (PCBA). One example apparatus can include a PCBA of a solid state drive (SSD) and a damper configured to contact the PCBA, contact an enclosure of the SSD, and damp shock impulses applied to the SSD.

20 Claims, 7 Drawing Sheets

(56) References Cited

U.S. PATENT DOCUMENTS

| | | | | |
|---|---|---|---|---|
| 2006/0245156 | A1* | 11/2006 | Sun | G06F 1/187 |
| 2007/0030639 | A1* | 2/2007 | Ko | G11B 33/08 |
| 2008/0037211 | A1* | 2/2008 | Martin | G11B 33/122<br>361/679.55 |
| 2008/0272070 | A1* | 11/2008 | Hung | G11B 33/124 |
| 2009/0122505 | A1* | 5/2009 | Lu | H05K 1/0271<br>361/809 |
| 2009/0310313 | A1* | 12/2009 | Han | H05K 1/0271<br>361/769 |
| 2011/0038123 | A1* | 2/2011 | Janik | H05K 7/20472<br>361/717 |
| 2011/0205710 | A1* | 8/2011 | Kondo | H05K 7/20436<br>361/714 |
| 2013/0112845 | A1* | 5/2013 | Gong | G06F 1/187<br>248/636 |
| 2015/0305169 | A1* | 10/2015 | Wakana | H05K 7/20454<br>361/709 |
| 2016/0183394 | A1* | 6/2016 | Raschilla | H05K 5/0217<br>361/752 |
| 2016/0212863 | A1* | 7/2016 | Yin | H05K 5/0004 |
| 2017/0002885 | A1* | 1/2017 | Mueller | H05K 7/1417 |
| 2018/0063984 | A1* | 3/2018 | Clements | H01M 10/425 |
| 2018/0092240 | A1* | 3/2018 | Rojahn | H05K 1/18 |
| 2019/0373750 | A1* | 12/2019 | Omote | H05K 7/1417 |
| 2020/0068729 | A1* | 2/2020 | Kim | H05K 5/0056 |
| 2022/0022329 | A1* | 1/2022 | Li | H05K 7/142 |
| 2022/0210932 | A1* | 6/2022 | Tada | H05K 5/0217 |
| 2024/0179854 | A1* | 5/2024 | Holm | H05K 5/0217 |

* cited by examiner

DAMPER FOR A PRINTED CIRCUIT BOARD ASSEMBLY

TECHNICAL FIELD

The present disclosure relates generally to printed circuit board assemblies, and more particularly, to apparatuses, methods, and systems for damping shock impulses.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others. A memory device can be included on a printed circuit board assembly (PCBA).

DETAILED DESCRIPTION

Figure 1:
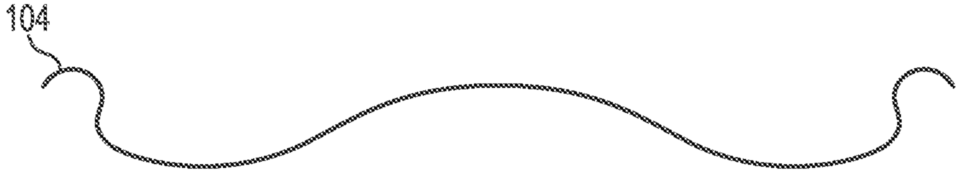
FIG. 1 is a schematic diagram of damper in accordance with a number of embodiments of the present disclosure.

Apparatuses, systems, and methods for damping shock impulses for a printed circuit board assembly (PCBA) are provided herein. In a number of embodiments of the present disclosure, an apparatus can include a PCBA of a solid state drive (SSD) and a damper configured to contact the PCBA, contact an enclosure of the SSD, and damp shock impulses applied to the SSD.

SSDs can fail when exposed to gravitational forces (g-forces). When an SSD is exposed to g-forces, shock impulses can be applied to components within the SSD including a PCBA. A printed circuit board (PCB) of the PCBA can be fastened with screws, for example, to an enclosure of the PCBA. Rigidly fastening the PCB to the enclosure can cause the PCBA to absorb shock impulses. The PCBA can deflect, which can cause stress to the PCBA.

A damper can absorb the shock impulses to prevent or reduce the amount of shock impulses received by the PCBA. This can reduce or prevent deflection of the PCB. Deflection of the PCB can break solder joints and/or the PCB leading to destruction of the SSD and/or the data stored thereon.

In some examples, a damper can allow for a single insertion of the PCBA without screws, which can make assembly of an SSD easier. For example, a pick and place automation tool can insert the PCBA into the enclosure of the SSD without needing additional automation tools, for example a screw driving robot, to fasten the PCBA to the enclosure.

Coupling the PCBA to the enclosure without the use of fasteners, such as screws, can increase the amount of space on the PCB. Often, a PCB includes a number of openings that receive screws to fasten the PCBA to the enclosure. The damper can couple the PCBA to the enclosure by applying a spring force to the sides and/or edges of the PCB. Accordingly, screws may no longer be needed, and the space consumed by the openings can be reallocated to components, which can improve performance of the SSD or the overall footprint of the PCB can be reduced, which can reduce the overall size and cost of the SSD.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more of such things. For example, a number of dampers can refer to one or more dampers. Additionally, designators such as "X" and "Z", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a schematic diagram of damper 104 in accordance with a number of embodiments of the present disclosure. The damper can be formed from metal, plastic, rubber, and/or foam. In some examples, the damper can be a spring, as illustrated in FIG. 1. The damper 104 can absorb shock impulses to prevent or reduce shock impulses received by a PCBA.

Figure 2:
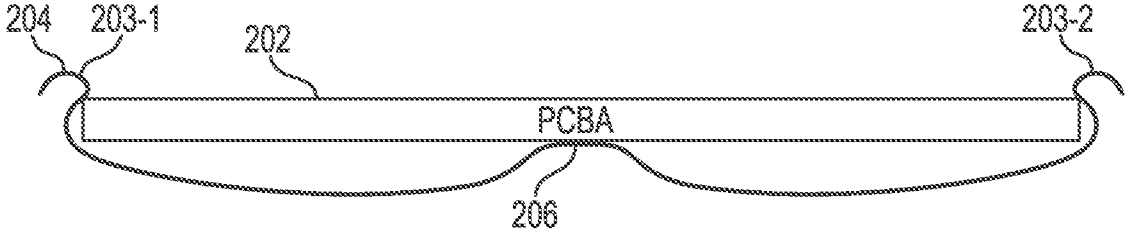
FIG. 2 is a schematic diagram of an apparatus including a PCBA coupled to a damper in accordance with a number of embodiments of the present disclosure.

FIG. 2 is a schematic diagram of an apparatus including a PCBA 202 coupled to a damper 204 in accordance with a number of embodiments of the present disclosure. The PCBA 202 can include a printed circuit board (PCB). The PCB can be a single layer PCB, for example a copper layer. In some examples, the PCB can include multiple layers. The PCBA 202 can include a number of electronic components coupled to the PCB. In some examples, the number of electronic components can be soldered into position on the PCB.

The damper 204 can include a number of pre-loaded spring portions 203-1 and 203-2 to receive the PCBA 202 and prevent the PCBA 202 from being released from the damper 204. The pre-loaded spring portions 203-1 and 203-2 can also deform in response to shock impulses to damp shock impulses applied to the SSD and prevent the PCBA 202 from contacting an enclosure.

The damper 204 can further include a pedestal portion 206. The pedestal portion 206 can likewise deform in response to shock impulses to damp shock impulses applied to the SSD and prevent the PCBA 202 from contacting the enclosure. The pedestal portion 206 can also support the PCBA 202 to prevent the PCBA 202 from deforming. In a number of embodiments, the damper 204 can include a number of pedestal portions 206 supporting a number of different portions of the PCBA 202.

Figure 3:
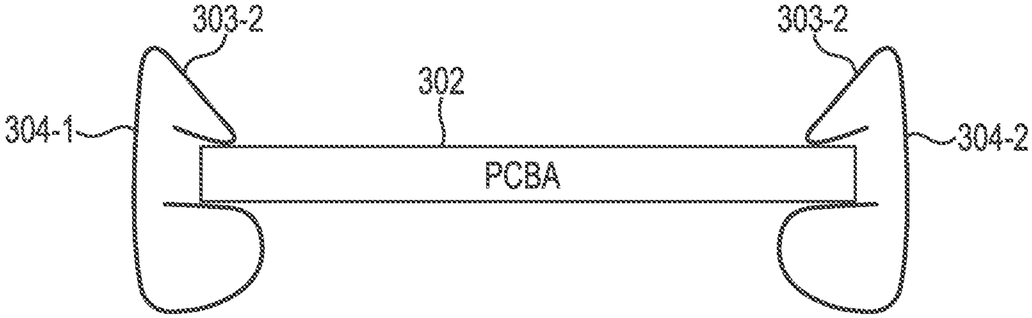
FIG. 3 is a schematic diagram of an apparatus including a PCBA coupled to a number of dampers in accordance with a number of embodiments of the present disclosure.

FIG. 3 is a schematic diagram of an apparatus including a PCBA 302 coupled to a number of dampers 304-1 and 304-2 in accordance with a number of embodiments of the present disclosure. Each of the number of dampers 304-1 and 304-2 can include a pre-loaded spring portion 303-1 and 303-2 to receive the PCBA 302, prevent the PCBA 302 from being released from the number of dampers 304-1 and 304-2, and prevent the PCBA 302 from contacting an enclosure.

Figure 4:
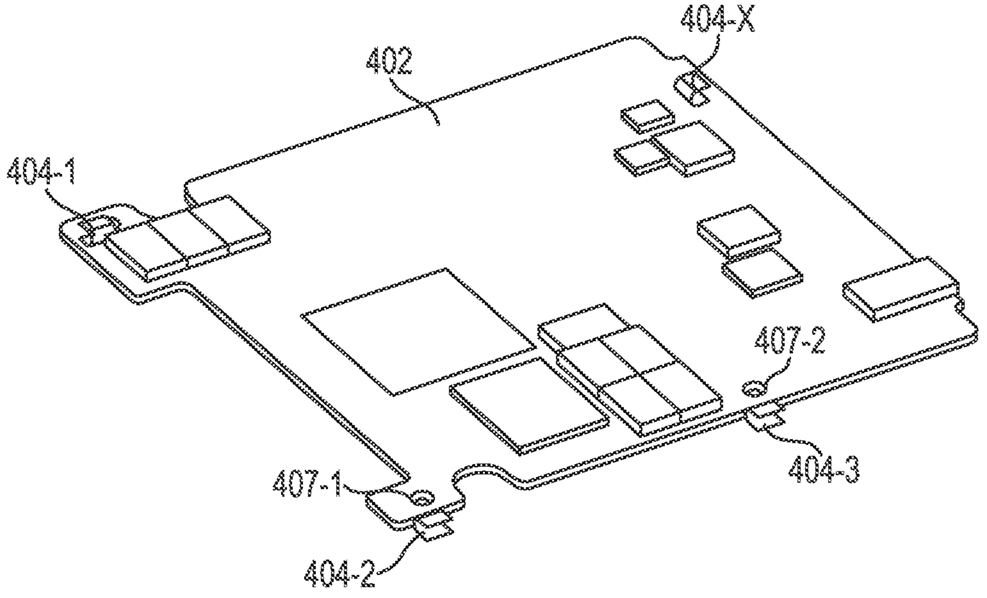
FIG. 4 is a schematic diagram of an apparatus including a PCBA coupled to a number of dampers in accordance with a number of embodiments of the present disclosure.

FIG. 4 is a schematic diagram of an apparatus including a PCBA 402 coupled to a number of dampers 404-1, 404-2, 404-3, and 404-X in accordance with a number of embodiments of the present disclosure. The number of dampers 404-1, . . . , 404-X, as illustrated in FIG. 4, can be springs.

The number of dampers 404-1, . . . , 404-X can contact one or more sides of the PCBA 402. The number of dampers 404-1, . . . , 404-X can replace fasteners, such as screws, which are ordinarily used to maintain the PCBA 402 in place. Often, a PCBA 402 includes a number of openings 407-1 and 407-2 for these screws. If the number of dampers 401-1, . . . , 404-X replace the screws, the number of openings 407-1 and 407-2 are no longer needed and the space consumed by the openings can be reallocated to components. The space consumed by the openings can be reallocated to components that can improve performance of an SSD or the overall footprint of the PCBA 402 can be reduced, which can reduce the overall size and cost of the SSD.

Figure 5A:
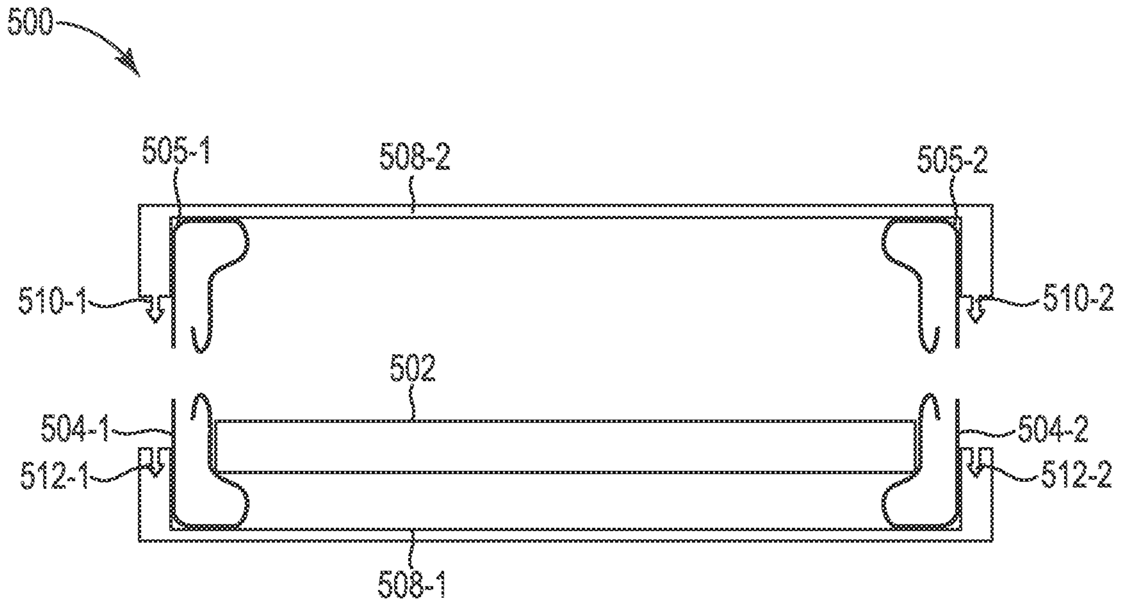
FIG. 5A is a schematic diagram of a disassembled enclosed PCBA in accordance with a number of embodiments of the present disclosure.
Figure 5B:
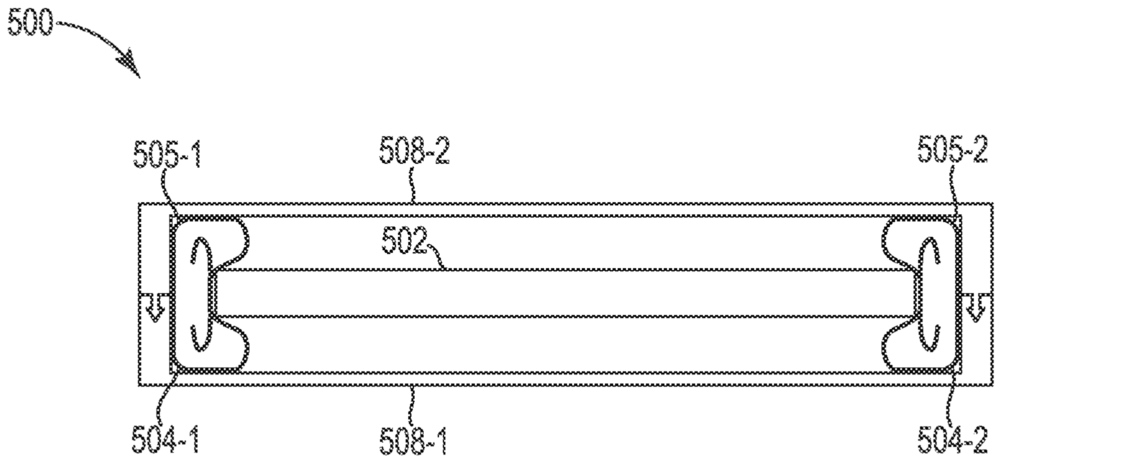
FIG. 5B is a schematic diagram of an assembled enclosed PCBA in accordance with a number of embodiments of the present disclosure.
Figure 5C:
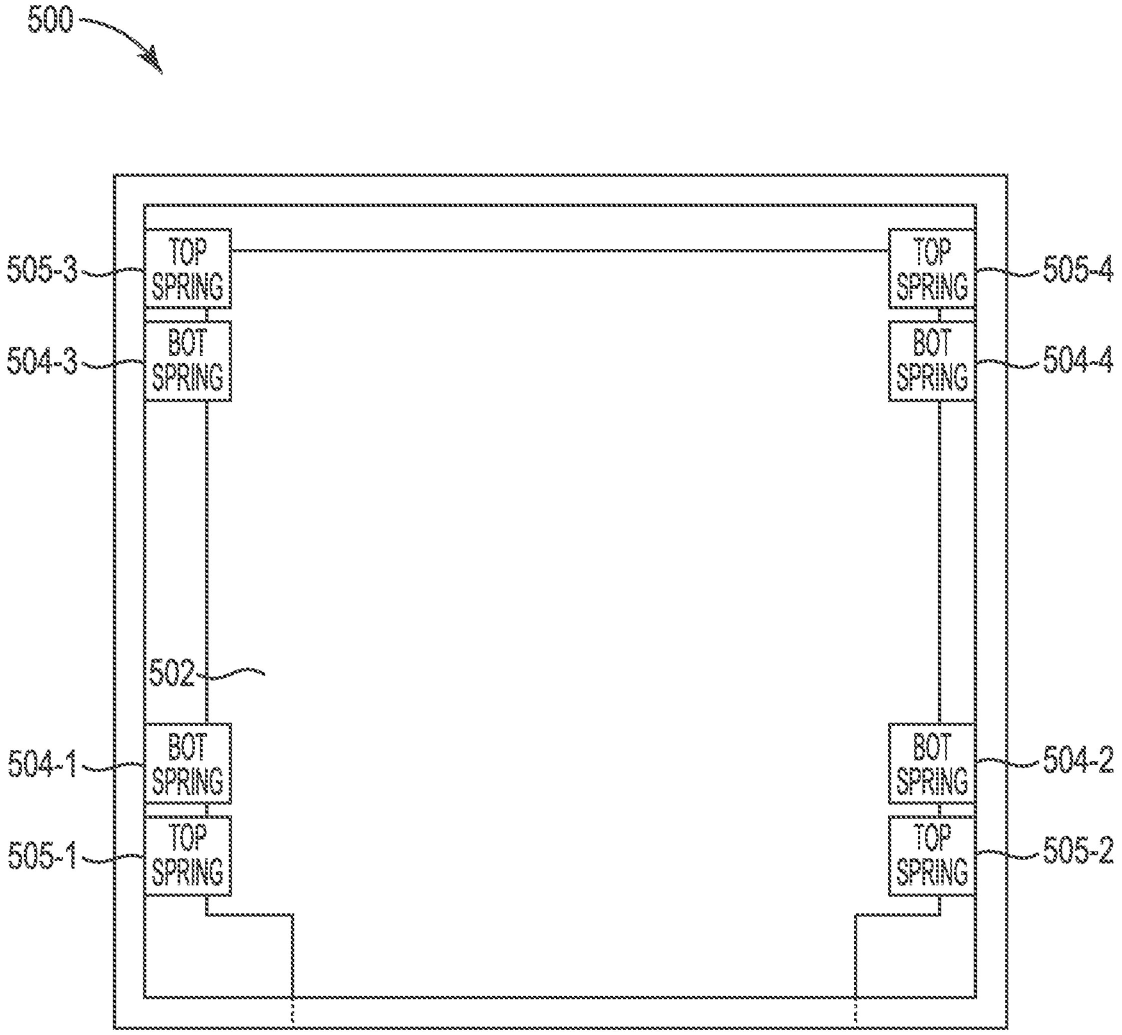
FIG. 5C is a schematic diagram of an assembled enclosed PCBA in accordance with a number of embodiments of the present disclosure.

FIG. 5A is a schematic diagram of a disassembled enclosed PCBA 500 and FIGS. 5B and 5C are a schematic diagrams of an assembled enclosed PCBA 500 in accordance with a number of embodiments of the present disclosure. The enclosed PCBA 500 can be a computing system including memory storage devices combined together. The enclosed PCBA 500 can be an SSD, for example. In a number of embodiments, the enclosed PCBA 500 can include non-volatile memory (e.g., NAND flash memory, NOR flash memory, and/or wireless memory), and/or can include volatile memory (e.g., DRAM and/or SRAM), among various other types of non-volatile and volatile memory. Flash memory devices can include memory cells storing data in a charge storage structure such as a floating gate or charge trap, for instance, and may be utilized as non-volatile memory for a wide range of electronic applications. Flash memory devices may use a one-transistor memory cell that allows for high memory densities, high reliability, and low power consumption.

The enclosed PCBA 500 can include a PCBA 502, a number of dampers 504-1, 504-2, 505-1, and 505-2, a first portion of an enclosure 508-1, and a second portion of an enclosure 508-2. The first portion of the enclosure 508-1 can include voids 512-1 and 512-2 configured to receive the insertion tabs 510-1 and 510-2 coupled to or included in the second portion of the enclosure 508-2. The voids 512-1 and 512-2 and insertion tabs 510-1 and 510-2 can be shaped to lock the first portion of the enclosure 508-1 to the second portion of the enclosure 508-2, as illustrated in FIG. 5B.

Damper 504-1 and damper 505-1 can receive each other and damper 504-2 and damper 505-2 can receive each other. In some examples, damper 504-1 and 505-1 can be formed to lock together and damper 504-2 and 505-2 can be formed to lock together, as illustrated in FIG. 5B.

In a number of embodiments, the dampers 504-1, 504-2, 504-3, 504-4, 505-1, 505-2, 505-3, and 505-4 can be staggered around the PCBA 502, as illustrated in FIG. 5C. The dampers 504-1, 504-2, 504-3, 504-4, 505-1, 505-2, 505-3, and 505-4 can contact the first portion of the enclosure 508-1 and/or the second portion of the enclosure 508-2 and prevent the PCBA 502 from contacting the first portion of the enclosure 508-1 and the second portion of the enclosure 508-2 to prevent damage from occurring to the PCBA 502.

Figure 6:
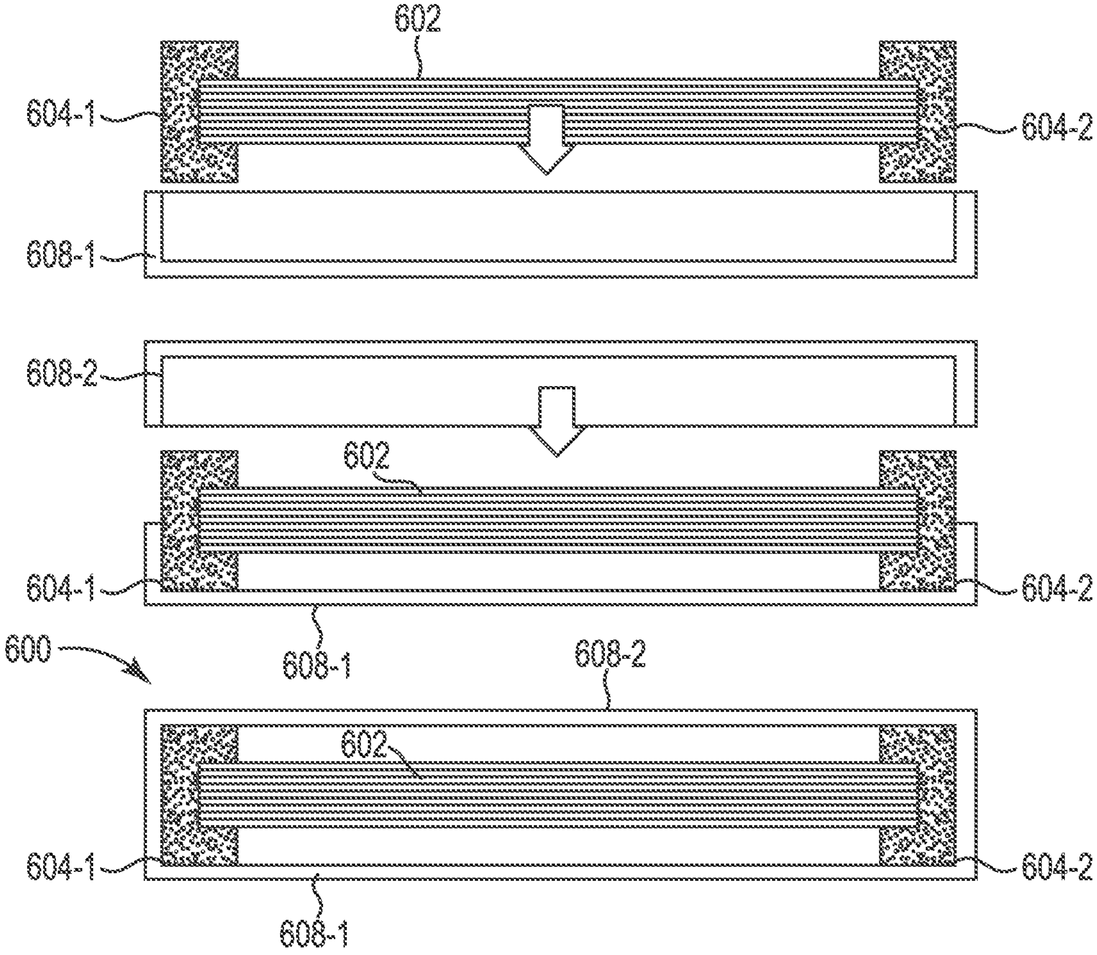
FIG. 6 is a schematic diagram of an enclosed PCBA in accordance with a number of embodiments of the present disclosure.

FIG. 6 is a schematic diagram of an enclosed PCBA 600 assembly in accordance with a number of embodiments of the present disclosure. The number of dampers 604-1 and 604-2 can be coupled to PCBA 602. In some examples, the dampers 604-1 and 604-2 can be coupled to the PCBA 602 mechanically or via an adhesive.

The PCBA 602 and the number of dampers 604-1 and 604-2 coupled to the PCBA 602 can then be placed into a first portion of an enclosure 608-1. A second portion of an enclosure 608-2 can then be placed on and coupled to the first portion of the enclosure 608-1 to enclose the PCBA 602 and the number of dampers 604-1 and 604-2. In a number of embodiments, the dampers 604-1 and 604-2 can be coupled to the first portion of the enclosure 608-1 and/or the second portion of the enclosure 608-2 mechanically or via an adhesive.

The PCBA 602 can be removably coupled to the first portion of the enclosure 608-1 and/or the second portion of the enclosure 608-2 via the number of dampers 604-1 and 604-2. The number of dampers 604-1 and 604-2 can damp a shock impulse between the first portion of the enclosure 608-1 and/or the second portion of the enclosure 608-2 and the PCBA 602.

In some examples, the dampers 604-1 and 604-2 can include a number of portions. For example a lower portion of damper 604-1 and a lower portion of damper 604-2 can be placed inside the first portion of the enclosure 608-1. The PCBA 602 can be placed on the lower portion of damper 604-1 and damper 604-2 then an upper portion of damper 604-1 can be placed on the lower portion of damper 604-1 and an upper portion of damper 604-2 can be placed on the lower portion of damper 604-2. The second portion of the enclosure 608-2 can then be placed on and coupled to the first portion of the enclosure 608-1.

In a number of embodiments, the dampers 604-1 and/or 604-2 and/or portions of the dampers 604-1 and/or 604-2 can be formed from the first portion of the enclosure 608-1 and/or the second portion of the enclosure 608-2. For example, the lower portions of dampers 604-1 and 604-2 can be a part of the first portion of the enclosure 608-1 and/or the upper portions of dampers 604-1 and 604-2 can be a part of the second portion of the enclosure 608-2.

In some examples, the dampers 604-1 and/or 604-2 and/or portions of the dampers 604-1 and/or 604-2 can be coupled to the first portion of the enclosure 608-1 and/or the second portion of the enclosure 608-2 prior to receiving the PCBA 602. For example, the lower portions of dampers 604-1 and 604-2 can be coupled to the first portion of the enclosure 608-1 and/or the upper portions of dampers 604-1 and 604-2 can be coupled to the second portion of the enclosure 608-2 prior to contacting the PCBA 602.

Figure 7:
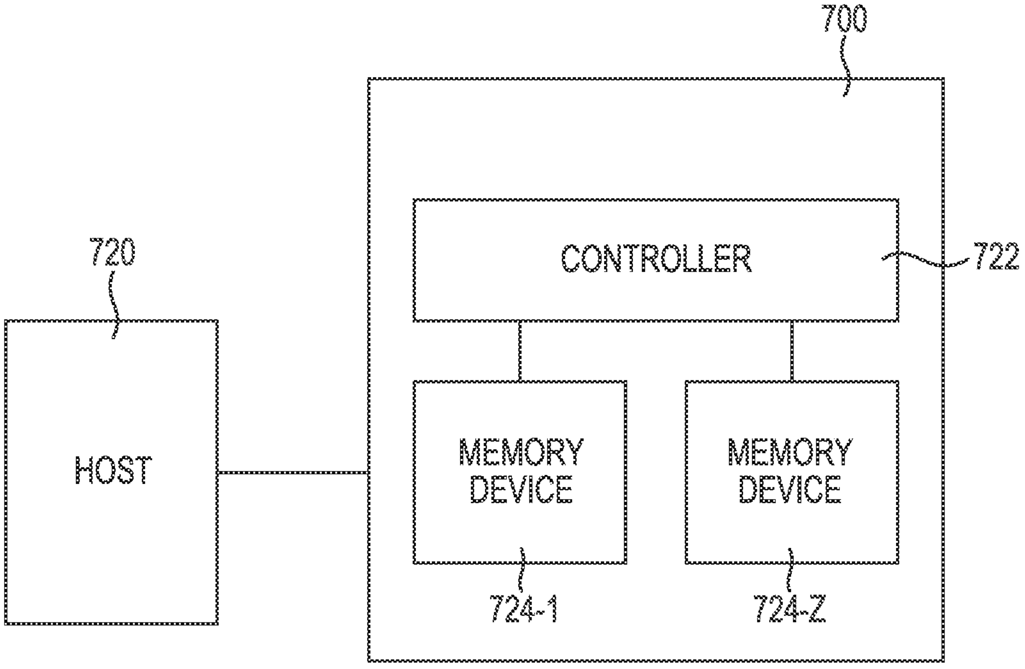
FIG. 7 is a block diagram of a host coupled to an enclosed PCBA in accordance with a number of embodiments of the present disclosure.

FIG. 7 is a block diagram of a host 720 coupled to an enclosed PCBA 700 in accordance with a number of embodiments of the present disclosure. The enclosed PCBA 700 can be an SSD. The host 720 can provide data to and/or request data from the SSD.

The SSD can include a controller 722 and a number of memory devices 724-1, . . . , 724-Z. The controller 722 (e.g., an SSD controller), such as a processing device, can be coupled to the number of memory devices 724-1, . . . , 724-Z. The controller 722 can receive a request to store data at the number of memory devices 724-1, . . . , 724-Z and/or retrieve data from the number of memory devices 724-1, . . . , 724-Z. The controller 722 can transmit a command to one or more of the number of memory devices 724-1, . . . , 724-Z to store or retrieve data.

The host 720 can utilize the SSD to store data at a number of memory devices 724-1, . . . , 724-Z and/or to retrieve data from the number of memory devices 724-1, . . . , 724-Z. The number of memory devices 724-1, . . . , 724-Z can include non-volatile memory and/or volatile memory.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:

a printed circuit board assembly (PCBA) of a solid state drive (SSD); and a damper comprising:

a pedestal portion;

a first preloaded spring portion; and a second preloaded spring portion, wherein the damper is configured to:

receive the PCBA via the first preloaded spring portion, the second preloaded spring portion, and the pedestal portion of the damper;

contact the PCBA, wherein the first pre-loaded spring portion contacts a first edge of a first surface of the PCBA and a second pre-loaded spring portion contacts a second edge of the first surface of the PCBA, and the pedestal portion of the damper contacts a second surface of the PCBA that is opposite the first surface of the PCBA;

contact an enclosure of the SSD; and damp shock impulses applied to the SSD, wherein the damper is configured to deform in response to the shock impulses.

2. The apparatus of claim 1, wherein the first pre-loaded spring portion, the second pre-loaded spring portion, and the pedestal portion of the damper are configured to deform in response to the shock impulses.

3. The apparatus of claim 1, wherein the damper is coupled to the enclosure mechanically or via an adhesive.

4. The apparatus of claim 1, wherein the damper is formed from the enclosure.

5. The apparatus of claim 1, wherein the enclosure includes a first portion and a second portion.

6. The apparatus of claim 1, wherein the damper is a spring.

7. The apparatus of claim 1, wherein the damper is formed from at least one of:

metal, plastic, rubber, or foam.

8. The apparatus of claim 1, wherein the pedestal portion is configured to prevent the PCBA from contacting the enclosure.

9. A method, comprising:

removably coupling a printed circuit board assembly (PCBA) of a solid state drive (SSD) to an enclosure of the SSD via a damper with a first pre-loaded spring portion configured to contact a first edge of a first surface of the PCBA, a second pre-loaded spring portion configured to contact a second edge of the first surface of the PCBA, and a pedestal portion configured to contact a second surface of the PCBA that is opposite the first surface of the PCBA; and damping a shock impulse between the enclosure and the PCBA via the damper, wherein the first pre-loaded spring portion, the second pre-loaded spring portion, and the pedestal portion are configured to deform in response to the shock impulse.

10. The method of claim 9, further comprising coupling the damper to the PCBA mechanically or via an adhesive prior to removably coupling the PCBA to the enclosure via the damper.

11. The method of claim 10, further comprising removably coupling the PCBA to the enclosure via the damper by inserting the PCBA coupled to the damper into a first portion of the enclosure.

12. The method of claim 9, further comprising coupling the damper to a first portion of the enclosure mechanically or via an adhesive prior to removably coupling the PCBA to the enclosure via the damper.

13. The method of claim 12, further comprising removably coupling the PCBA to the enclosure via the damper by coupling the PCBA to the damper.

14. The method of claim 9, further comprising forming the damper from a first portion of the enclosure.

15. The method of claim 14, further comprising removably coupling the PCBA to the enclosure via the damper by inserting the PCBA into the first portion of the enclosure.

16. The method of claim 9, further comprising removably coupling the PCBA to the enclosure via the damper by coupling a second portion of the enclosure to a first portion of the enclosure, wherein the PCBA is enclosed by the first portion and the second portion of the enclosure in response to coupling the second portion to the first portion.

17. The method of claim 16, further comprising a different damper contacting the PCBA prior to coupling the second portion of the enclosure to the first portion of the enclosure.

18. The method of claim 17, further comprising coupling the different damper to the second portion of the enclosure prior to coupling the second portion of the enclosure to the first portion of the enclosure.

19. A system, comprising:

a damper with a first pre-loaded spring portion, a second pre-loaded spring portion, and a pedestal portion;

a printed circuit board assembly (PCBA); and a first and second portion of an enclosure configured to enclose the damper and the PCBA, wherein the first pre-loaded spring portion and the second pre-loaded spring portion of the damper are configured to receive the PCBA by contacting a first edge and a second edge of a first surface of the PCBA and the pedestal portion is configured to contact a second surface of the PCBA opposite the first surface of the PCBA and damp shock impulses applied to the system, and wherein the damper is configured to deform in response to the shock impulses.

20. The system of claim 19, wherein the system is a solid state drive (SSD).

* * * * *